US007060978B2

(12) United States Patent
Drexel et al.

(10) Patent No.: US 7,060,978 B2
(45) Date of Patent: Jun. 13, 2006

(54) DETECTOR SYSTEM FOR A PARTICLE BEAM APPARATUS, AND PARTICLE BEAM APPARATUS WITH SUCH A DETECTOR SYSTEM

(75) Inventors: Volker Drexel, Königsbronn (DE); Johannes Bihr, Aalen (DE); Gerd Benner, Aalen (DE); Stephan Kujawa, Berlin (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 47 days.

(21) Appl. No.: 09/808,714

(22) Filed: Mar. 14, 2001

(65) Prior Publication Data

US 2002/0011565 A1  Jan. 31, 2002

(30) Foreign Application Priority Data

Mar. 14, 2000 (DE) ................................. 100 12 314

(51) Int. Cl.
*H01J 37/28* (2006.01)

(52) U.S. Cl. ...................................... 250/310; 250/397
(58) Field of Classification Search ................ 250/310, 250/311, 396 R, 347, 306, 397, 308
See application file for complete search history.

(56) References Cited

U.S. PATENT DOCUMENTS

| 4,308,457 | A | * | 12/1981 | Reimer ....................... 250/397 |
| 4,926,054 | A | | 5/1990 | Frosien |
| 5,384,463 | A | * | 1/1995 | Honjo et al. ................ 250/398 |
| 5,424,541 | A | * | 6/1995 | Todokoro et al. ........... 250/310 |
| 5,872,358 | A | | 2/1999 | Todokoro et al. |
| 5,900,629 | A | | 5/1999 | Todokoro et al. |
| 6,407,387 | B1 | * | 6/2002 | Frosien et al. .............. 250/310 |
| 6,501,077 | B1 | * | 12/2002 | Sawahata et al. ........... 250/310 |
| 2001/0010357 | A1 | * | 8/2001 | Ose et al. ................... 250/311 |

FOREIGN PATENT DOCUMENTS

| DE | 198 28 476 A1 | 6/1998 |
| EP | 0 661 727 A2 | 12/1994 |
| EP | 0 721 201 A1 | 10/1996 |
| EP | 0 917 177 A1 | 11/1997 |
| EP | 0 917 178 A1 | 11/1997 |
| EP | 0 969 495 A2 | 5/2000 |

* cited by examiner

*Primary Examiner*—John R. Lee
*Assistant Examiner*—Phillip A Johnston

(57) ABSTRACT

A detector system for a particle beam apparatus, in particular for a scanning electron microscope, has a target structure, which in a central region near the optical axis includes an electron-converting material. The target structure also includes either a non-converting material in a region remote from the optical axis or the region remote from the optical axis is offset in the direction of the optical axis with respect to the region near the optical axis that includes the electron-converting material. The detector system makes possible separate detection of only back-scattered electrons or only secondary electrons.

20 Claims, 3 Drawing Sheets

DETECTOR SYSTEM FOR A PARTICLE BEAM APPARATUS, AND PARTICLE BEAM APPARATUS WITH SUCH A DETECTOR SYSTEM

BACKGROUND OF THE INVENTION

1. Technical Field

The present invention relates to a detector system for a particle beam apparatus and a particle beam apparatus with such a detector system.

In particle beam apparatuses, such as for example scanning electron microscopes, the object is as a rule to detect, for image production, the particles emitted from an object by irradiation with a focused beam of primary particles. The particles emitted from the object can be divided into two groups: the particles back-scattered at the object by scattering, and the secondary particles emitted due to the excitation of the object by the primary particle beam. The particles or corpuscles back-scattered at the object then have nearly the energy of the primary particles at the object, while the secondary particles, for example the secondary electrons, have in relation to their energy a wide energy spectrum in the range of a few eV, clearly below the energy of the primary particles.

2. Background Art

A scanning electron microscope with a target structure arranged off-axis in the beam path is known from EP 0 661 727-A1. Furthermore, a magnetic and an electrostatic deflecting field are provided in the beam path, respectively act at right angles to the optical axis and are mutually orthogonal, and are excited with respect to each other in the manner of a Wien filter such that the action of the magnetic field and of the electrostatic field on the primary electron beam vanishes exactly. The back-scattered electrons and secondary electrons, propagating in exactly the opposite direction to the primary electron beam, are deflected away from the optical axis of the electron microscope by this combination of magnetic and electrostatic fields, so that they strike the target structure. The particles striking the target structure produce in their turn tertiary particles, conversion electrons, which are subsequently detected with the aid of a scintillation detector.

In order to detect only the back-scattered electrons in this detection system, a further electrostatic field perpendicular to the optical axis can be applied before the superposed magnetic and electrostatic field in the propagation direction of the secondary electrons; by means of it, the secondary electrons can be prevented from actually reaching the conversion electrode. Such an electrostatic field perpendicular to the optical axis can however only be applied without substantially affecting the primary beam when the secondary electrons also have only a very low energy with respect to the energy of the primary beam in the region of this deflecting field. In scanning electron microscopes in which the particles emitted by the specimen are accelerated back by an electrostatic lens into the beam guiding tube of the electron microscope, as is the case, for example, in the systems described in U.S. Pat. Nos. 4,831,266, 4,926,054, and DE-A1 198 29 476.4, and also the secondary electrons have at this place approximately the same energy as the primary electrons, due to this acceleration in the beam guiding tube, such a suppression of the secondary electrons without substantially affecting the primary particle beam is not possible.

In U.S. Pat. Nos. 5,900,629, 5,872,358, and the already mentioned DE-A1 198 28 476, further scanning electron microscopes are described, with a conversion diaphragm for the indirect detection of the secondary electrons and back-scattered electrons. However, a separate detection of the secondary electrons and of the back-scattered electrons is not considered in these documents.

A further detector system for a scanning electron microscope is described in EP-A1 0 917 178. This detector system has a diaphragm which is provided with a scintillation layer. The photons emitted by the scintillation layer due to bombardment with back-scattered electrons or secondary electrons are detected by means of a detector. With this system also, no separation is possible of the signal according to secondary electrons and back-scattered electrons.

A scanning electron microscope is described in EP-A1 0 917 177 which has a sequence of a magnetic, an electrostatic, and a second magnetic deflection field, for the spatial separation of the secondary electrons from the primary particles. Here also, no separation is possible of the signals produced by secondary electrons and by back-scattered electrons.

SUMMARY OF THE INVENTION

The present invention has as its object to provide a detection system, particularly for a particle beam apparatus, with which system the secondary particles emitted from the object or the particles which are back-scattered at the object can be selectively detected. Here the detection system is also to be usable when the kinetic energies of the primary particles, the secondary particles, and the back-scattered particles at the location of detection differ only slightly from each other. This object is attained according to the invention by means of detector systems for a particle beam apparatus, having a target structure arranged in a beam path of the particle beam apparatus, wherein the target structure has a near axis region adjacent to the optical axis of the particle beam apparatus, a central region of a strongly electron-converting material, and a region remote from the optical axis at which the target structure is received within the particle beam apparatus central region. Advantageous developments of the invention will become apparent from the features of the dependent claims.

The detector system according to the invention has a target structure which consists of a material strongly converting electrons, in a central region near the axis, adjoining the optical axis of the particle beam apparatus, and which is received at a region remote from the axis.

The region remote from the axis can be spaced apart further from the object in comparison with the near-axis region. Alternatively, the region remote from the axis can be constituted as a half-ring and the region near the axis as a web connecting the ends of the half-ring. It is furthermore possible that the region remote from the axis consists of a material which only weakly converts electrons.

The detector system according to the invention is preferably applied in combination with a deflecting system consisting of an electrostatic and a magnetic field, the field directions of which are mutually perpendicular and perpendicular to the optical axis of the particle beam apparatus. The two mutually perpendicular deflecting fields can then be set with respect to each other such that the effects of the two deflecting fields on the primary beam are suppressed, but at the same time such that they deflect the particles emitted from, or back-scattered by, the specimen away from the optical axis of the particle beam apparatus and toward the target structure. The conditions can then be set, by means of different deflection field strengths, such that only the secondary electrons reach the strongly electron-converting region, near the axis, of the target structure. In this case of a relatively weak excitation of the deflecting fields, the electrons back-scattered at the object pass through the target structure in the region of the optical axis because of their slightly higher energy. With a stronger excitation of the two deflecting fields, the particles back-scattered at the object are also deflected to the near-axis region of the target structure, and strike this. With this stronger excitation of the deflecting fields, however, the secondary particles are already so strongly deflected by the deflecting fields that they either strike the target structure in the region, remote from the axis, of material which only weakly converts electrons, or strike the target structure in the region situated more remote from the axis, and thereby in regions in which either no tertiary particles are released, or these, in the manner of a particle trap, are kept far from the detection system serving to detect the particles emitted from the target structure.

In all embodiments of the invention, the separation takes place between secondary particles and back-scattered particles by means of a strict spatial limitation of the detection region of the target structure in a direction perpendicular to the optical axis of the particle beam apparatus. The dimensions of the central, near-axis region of the target structure, on the one hand, and the distance of the target structure from the optical axis, are then chosen such that either only the secondary particles or only the particles back-scattered at the object can strike the converting region of the target structure. The region of the target structure near the axis is constituted for this purpose in the form of a web, with the narrow web side parallel to the direction of the electrostatic deflecting field, or as a narrow ring, or a section of a narrow ring. The web width or ring width is then chosen corresponding to the desired energy resolution.

In an advantageous embodiment example of the invention, the electrostatic deflecting field and the magnetic deflecting field are arranged offset from each other in the direction of the optical axis of the particle beam apparatus.

In a further advantageous embodiment example, two magnetic deflecting fields and an electrostatic deflecting field are provided. By means of this combination of a total of three fields, the deflecting system can also serve simultaneously for the adjustment of the primary particle beam to the optical axis of the objective.

The electrostatic field and the magnetic field are preferably to be adjustable independently of each other, so that the required degree of freedom is insured for an adjustment of the primary electron beam relative to the optical axis of the particle beam apparatus.

A detection system is of course provided for the detection of the particles emitted by the target structure. This is preferably at a positive potential relative to the target structure, so that the particles emitted from the target structure are accelerated toward the detection system.

An electrode, for example, a grid electrode or a perforated diaphragm, is preferably arranged before the detection system. This electrode, which is to be at a positive potential with respect to the target structure, can then fulfill a double function, namely on the one hand for the extraction of the particles emitted by the target structure, and at the same time for the production of an electrostatic deflecting field.

Alternatively, a perforated diaphragm at the potential of the target structure is also possible, with a detector arranged behind it and at a positive potential with respect to the target structure and the perforated diaphragm. The electrostatic field produced between the detector and the perforated diaphragm then reaches through the perforated diaphragm, and this penetration then forms the electrostatic deflecting field, which at the same time also serves for the extraction of the particles emitted by the target structure.

Since the conversion electrons emerge from the target structure with a lower energy than the primary beam, an efficient extraction of the conversion electrons is already insured with a quite weak electrostatic extraction field.

BRIEF DESCRIPTION OF THE DRAWINGS

Particulars of the invention are described in further detail hereinbelow with the aid of the accompanying drawings. In detail.

DETAILED DESCRIPTION OF THE EMBODIMENTS

Figure 1:
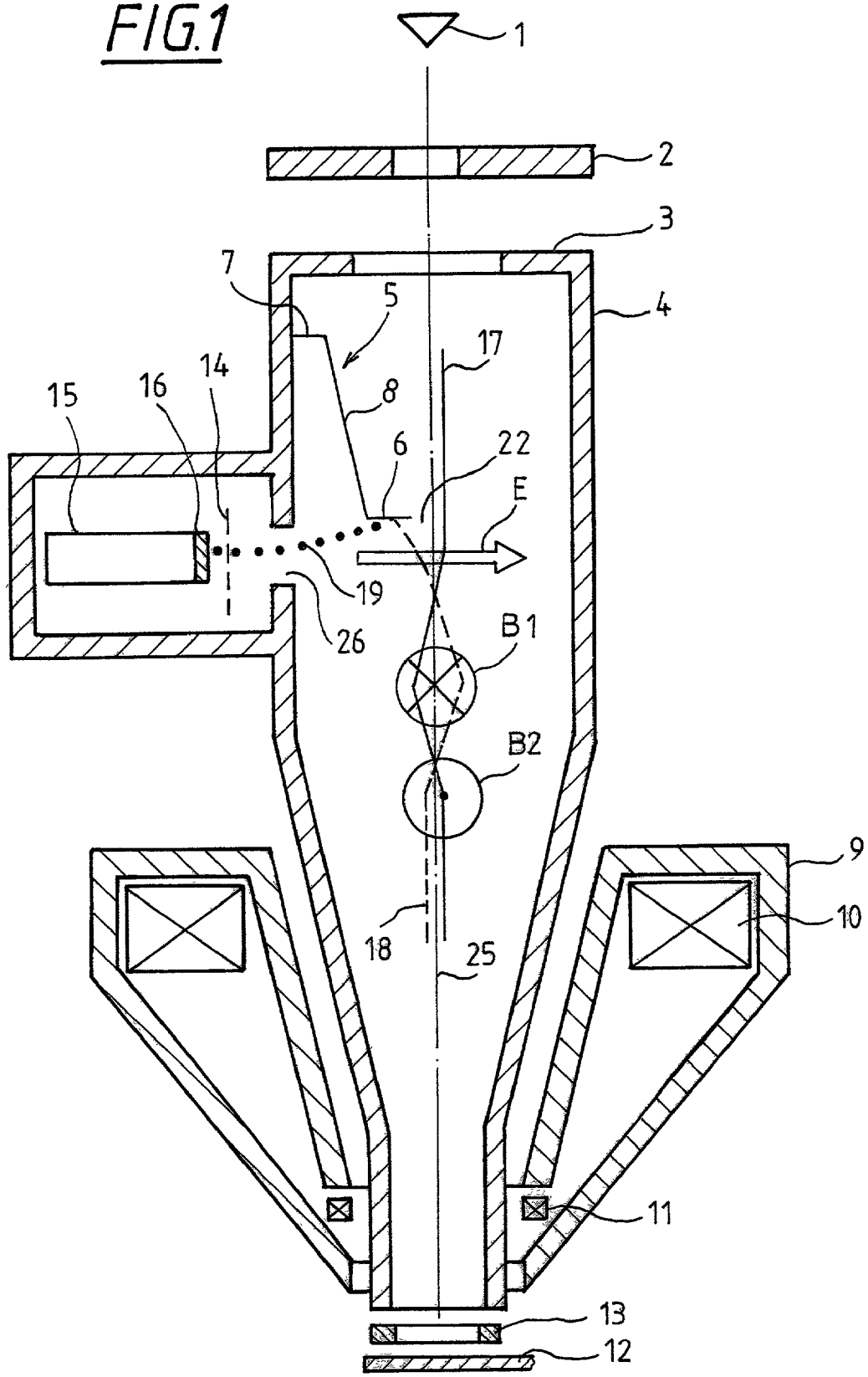
FIG. 1 shows a section through a scanning electron microscope with a detector system according to the invention.

The scanning electron microscope shown in FIG. 1 has a basic structure corresponding to that of the scanning electron microscope in DE-A1 198 28 476. The particle beam producer consists of a particle-emitting cathode (1), an extraction electrode (2), and an anode (3). When the particle beam apparatus is constituted as a scanning electron microscope, the cathode (1) is preferably a thermionic field emitter. The particles emerging from the cathode (1) are accelerated to the anode potential by the potential difference (not shown in FIG. 1) between the cathode (1) and the anode (3).

The anode (3) simultaneously forms the source-side end of the beam guiding tube (4). This beam guiding tube (4) of electrically conductive material is passed through the bore through the pole shoe (9) of a magnetic lens with an annular magnetic coil (10) acting as the objective, and is constituted on the object-side end as a tubular electrode. The beam guiding tube is followed by a single electrode (13) which forms, together with the tubular electrode of the beam guiding tube, an electrostatic deceleration device. The tubular electrode, in common with the whole beam guiding tube, is at the anode potential, while the single electrode (13) and the specimen (12) are at a potential lower than the anode potential, so that the particles after emerging from the beam guiding tube are braked to the desired lower energy.

A further deflecting system (11) is arranged in the bore of the pole shoe (9) of the objective lens at the height of the pole shoe gap; by means of the said system (11), the primary electron beam focused onto the specimen (12) by the objective (9) is deflected perpendicular to the optical axis (25), shown as a dot-dash line, for scanning the specimen (12).

As an alternative to the illustration in FIG. 1, the beam guiding tube (4) can also end at about the height of the pole shoe gap of the pole shoe (9), and the braking electrode (13) can also be arranged about at the height of the pole shoe gap. The braking of the primary particles to the desired incident energy then already takes place within the objective, so that the magnetic field of the objective lens and the electrostatic deceleration field spatially overlap.

A multiple deflection system is arranged within the beam guiding tube between the anode (3) and the objective (9), and consists of two magnetic dipole fields (B1, B2) connected in series one behind the other and a further, transverse electric field (E). The field directions, both of the two magnetic dipole fields (B1, B2) and of the transverse electric dipole field (E), are all aligned perpendicular to the optical axis (25), the field directions of the two magnetic dipole fields (B1, B2) being in their turn perpendicular to the field direction of the electrostatic dipole field (E). In the embodiment example shown in FIG. 1, the two magnetic dipole fields are furthermore antiparallel to each other, and follow one another. The field strengths of all three dipole fields (B1, B2, E) can be set independently of each other. The electrostatic dipole is here arranged on the source side of the magnetic dipoles.

The detector system (5) according to the invention is furthermore arranged between the anode (3) and the electrostatic dipole field (E). This detector system substantially has a target structure which is arranged to one side of the optical axis and which is substantially Z-shaped in cross section. The target structure (5) has a region (7) which is distanced in the radial direction from the optical axis (25), and at which the target structure is received within the beam guiding tube (4). The target structure is constituted in an intermediate region (8) as a cone piece, so that in this intermediate region (8) the intersection surfaces of the target structure in a plane containing the optical axis run either parallel to the optical axis or inclined to the optical axis, the inclination being chosen so that the distance of the target structure from the optical axis (25) becomes smaller in the direction of propagation of the primary electron beam. At the end of the intermediate region (8), the target structure has a distance (22) from the optical axis (25) for the primary electrons to pass through. The target structure (5) furthermore has a central region (6) of electron converting material neighboring the optical axis (25), and thus of material which emits conversion electrons with relatively high efficiency when bombarded by particles. Possible materials for this electron converting region are metals of high atomic number such as gold, copper, and platinum. The surface in this region neighboring the optical axis is then perpendicular to the optical axis (25). The target structure is at the potential of the beam guiding tube. The conversion electrons emitted by the target structure can be detected by means of a suitable detection system. A photomultiplier (15) with a scintillator (16) arranged before it serves as the detection system in the embodiment example shown in FIG. 1. The detection system is at a positive potential with respect to the beam guiding tube.

The distance between the edge of the electron-converting region (6) of the target structure (5) facing toward the optical axis (25) and the optical axis is about 0.2–3 mm. The detection system (14, 15, 16) itself is arranged outside the beam guiding tube (4), behind a hole (26) through the wall of the beam guiding tube (4). The position of the hole (26) is chosen such that the hole (26) is situated immediately in front of the plane of the electron-converting region (6) in the propagation direction of the secondary electrons and the back-scattered electrons; the source side edge of the hole (26) thus coincides with the plane of the electron-converting region (6). The diameter of the hole or its edge length is 2–8 mm here.

The detection system furthermore has an electrode (14) which is constricted either as a grid electrode or as a perforated electrode and is at a positive potential with respect to the beam guiding tube (4). This electrode (14) then on the one hand forms an electron extraction field for the conversion electrons emitted from the electron-converting region (6) of the target structure (5), and simultaneously this electrode, in common with the beam guiding tube (4), produces the electrostatic dipole field (E). The grid electrode (14) is then at between +10 V and +1000 V with respect to the beam guiding tube (4) and the target structure (5). The scintillator (16), in common with the photomultiplier (15), is at +8 kV to +12 kV with respect to the grid electrode (14). The dipole field formed between the grid electrode (14) and the beam guiding tube (4) then reaches through the hole (26) of the beam guiding tube (4), and it is thus attained that the electrostatic dipole field (E) is strongly localized within the beam guiding tube (4), and conversion electrons which are produced in places other than in the electron-converting region (6) are not extracted toward the detection system (15, 16).

The serial arrangement of the electrostatic dipole field (E) and the two further magnetic dipole fields (B1, B2) fulfills a double function in the present arrangement: on the one hand, these dipole fields serve for the separation from the primary electron beam of the secondary electrons and back-scattered electrons emitted by the specimen, and simultaneously these dipole fields serve to adjust the primary electron beam relative to the optical axis (25), which is defined by the optical axis of the objective (9, 10). A primary beam (17) (shown as a full line in FIG. 1) entering the electrostatic dipole field (E) is for this purpose first deflected by the electrostatic dipole field (E), deflected back by the first magnetic dipole field (B 1) to the optical axis (25) defined by the objective (9, 10), and turned back in direction by the second magnetic dipole field (B2) such that the primary electron beam after exiting the second magnetic dipole field (B2) proceeds on the optical axis (25) of the objective (9).

The secondary electrons released from the specimen (12) by bombardment with the primary particles, and the primary electrons (back-scattered electrons) back-scattered at the specimen (12) are accelerated back into the beam guiding tube (4) by the potential difference between the beam guiding tube (4) and the electrode (13). Since the energy of the primary electrons in the region of the specimen (12) is substantially smaller than the energy of the primary electrons within the beam guiding tube (4) in numerous applications in both biology and semiconductor research, both the secondary electrons and also the electrons back-scattered at the specimen (12) have within the beam guiding tube (4) an energy which almost corresponds to the energy of the primary electrons. The energy of the back-scattered electrons is then as usual slightly higher than the energy of the secondary electrons. With a potential difference of 15 kV, for example, between the cathode (1) and the anode (3), and a potential difference of 1 kV between the cathode (1) and the braking electrode (13), the primary electrons within the beam guiding tube (4) have an energy of 16 keV and are braked between the exit from the beam guiding tube (4) and the braking electrode to 1 keV. The primary electrons then strike the specimen (12) with an energy of 1 keV. The electrons back-scattered at the specimen (12) undergo only a small energy loss and are consequently accelerated between the braking electrode (13) and the re-entry into the beam guiding tube (4) to almost 16 keV. The secondary electrons coming out of the specimen (12) have in contrast only a very low kinetic energy of a few electron volts, but are however accelerated between the braking electrode (13) and the re-entry into the beam guiding tube (4) to an energy of about 15 keV.

The further course of the secondary electrons within the beam guiding tube (4) is shown dashed in FIG. 1 as the course of the path 18. The secondary electrons undergo a deflection in the two magnetic dipole fields (B1, B2) which, due to their direction of motion opposite to that of the primary electrons (17), is opposite to that of the deflection of the primary electron beam (17). Since, however, the force direction of the electrostatic dipole field (E) is independent of the direction of motion, and the secondary and back-scattered electrons enter the electrostatic dipole field at an inclination opposite to the primary beam, a separation by the electrostatic dipole field (E) takes place of the secondary electrons and the back-scattered electrons from the path of the primary electrons. These electrons traveling backward are deflected by the electrostatic dipole field (E) onto the electron-converting region of the target structure (5) and produce conversion electrons, which are extracted to the detection system (15, 16) by the grid electrode (14) and the potential produced thereby. These conversion electrons are indicated dotted in FIG. 1 and are given the reference number (19).

Figure 2:
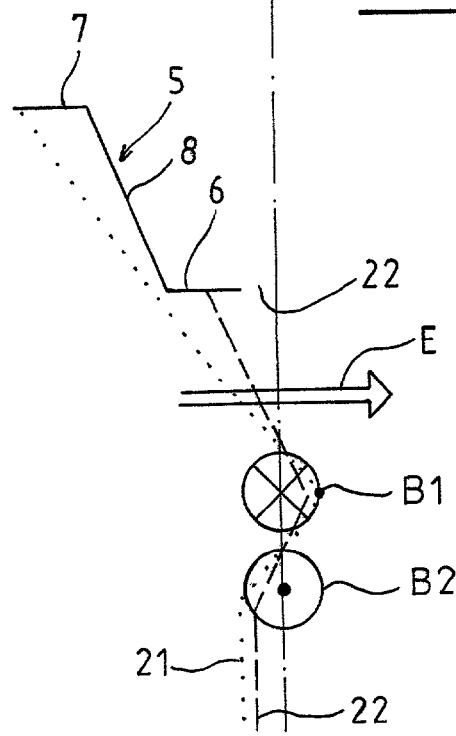
FIG. 2 shows an enlarged partial section of a scanning electron microscope with a detector system according to the invention, according to FIG. 1.

The separation between back-scattered electrons and secondary electrons with the arrangement according to FIG. 1 is explained in more detail in FIG. 2. In FIG. 2, the back-scattered electrons are indicated by a dashed line (20) and the secondary electrons by a dotted line (21). Due to their low kinetic energy, the secondary electrons undergo a stronger deflection within the magnetic dipole fields (B1, B2) than the back-scattered electrons (20). The action of the electrostatic dipole field is on the contrary identical on the back-scattered electrons and the secondary electrons. According to the excitation of the two magnetic dipole fields, the deflection undergone by the back-scattered electrons (20) and the secondary electrons (21) is consequently different. With a relatively strong excitation of the two magnetic dipole fields (B1, B2), the back-scattered electrons are caused to strike the electron-converting region (6) of the target structure (5). In contrast, the secondary electrons, because of their stronger deflection, go past the electron-converting region and strike the target structure (5) in the peripheral region (7). Since this peripheral region (7) is not electron-converting, or even if conversion electrons emerge to a small extent, because there is no electrostatic extraction field present in this region, they do not reach the detection system, and with this setting of the magnetic dipole fields (B1, B2), conversion electrons are exclusively detected which were released by the back-scattered electrons.

With a weaker excitation of the magnetic dipole fields (B1, B2) and a resulting weaker deflection of the secondary electrons and of the back-scattered electrons, it can be attained that the secondary electrons (21) strike the electron-converting region (6) of the target structure (5). Due to the weaker deflection of the back-scattered electrons, these then however go past the target structure into the region (22) nearest the axis, so that in this case exclusively conversion electrons are detected which were released by secondary electrons.

Figure 3:
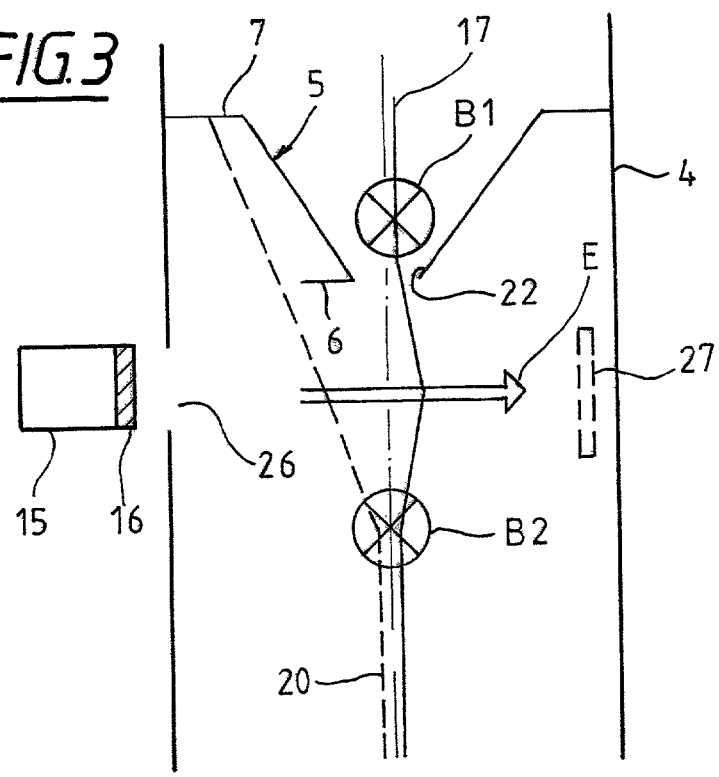
FIG. 3 shows an enlarged partial section of a scanning electron microscope with a detector system according to the invention, in a further embodiment example.

The embodiment example shown in FIG. 3 differs from the embodiment example shown in FIG. 1 only in the region shown, and otherwise corresponds to the embodiment example according to FIG. 1. In this embodiment example, on the one hand the sequence of the three dipole fields is interchanged, the electrostatic dipole field being produced between the two magnetic dipole fields (B1, B2) in the embodiment example according to FIG. 3. The spatial position of the electrostatic deflecting field (E) in relation to the position of the target structure then corresponds to the position in the embodiment example according to FIG. 1. The first magnetic dipole field in the propagation direction of the primary electron beam is then situated, seen in the propagation direction of the primary electron beam, before or at the height of the target structure (5). At the same time, in this embodiment example, the two magnetic dipole fields are directed parallel to each other. The separation between secondary electrons and back-scattered electrons takes place in this embodiment example completely analogously to the previously described embodiment example. The separation between secondary electrons and back-scattered electrons is of course clearly increased in contrast to the embodiment example according to FIGS. 1 and 2, since the energy-dependent deflection is increased within the magnetic dipole fields due to the parallel alignment of the two magnetic dipole fields (B1, B2).

As a further difference from the embodiment example according to FIGS. 1 and 2, the grid electrode (14) is dispensed with in the embodiment example according to FIG. 3. The electrodes for the electrostatic deflecting field are thereby directly formed by the scintillation detector (15, 16) and the outer wall of the beam guiding tube (4), and the field formed between these again reaches through the hole (26) of the beam guiding tube. This further difference is however not obligatorily combined with the altered sequence of the deflecting fields. Rather, it is conceivable to provide in addition a grid electrode between the scintillation detector (15, 16) and the hole through the beam guiding tube, even with the sequence of deflecting fields corresponding to the embodiment example according to FIG. 3, or to dispense with the grid electrode (14) with the sequence of deflecting fields corresponding to the embodiment example according to FIG. 1. Furthermore, an additional electrode (27) within the beam guiding tube and located opposite to the positive extraction electrode in relation to the optical axis (25) can be advantageous in both forms of embodiment. Such an additional electrode (27) is shown dashed in FIG. 3.

In the embodiment examples described with reference to FIGS. 1–3, the target structure (5) is respectively constituted with a Z-shaped cross section. An electron trap is thereby formed in the peripheral region of the target structure remote from the optical axis, and prevents conversion electrons produced in the region (7) of the target structure (5) remote from the optical axis from reaching the detector system. So that an effective separation is possible between the signals produced by the back-scattered electrons and the signals produced by secondary electrons, the distance in the direction of the optical axis between the region remote from the optical axis and the electron-converting region (6) near the optical axis is to be chosen so large that the electronic extraction field is not detectable, or is hardly detectable, in the region (7) remote from the axis, so that conversion electrons which are possibly produced in this region are not detected. According to the geometry of the beam guiding tube, distances of 1 mm or more in the direction of the optical axis are however sufficient for this purpose.

Figure 4:
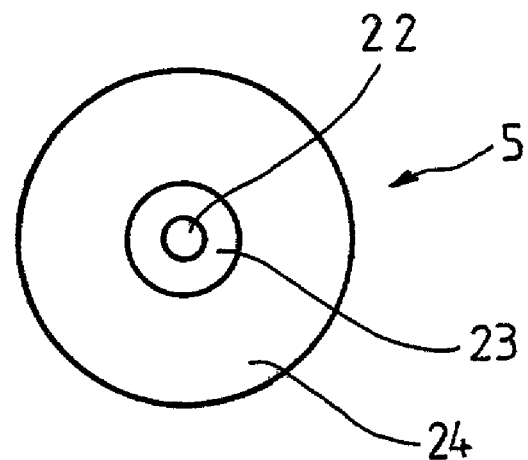
FIG. 4 shows a top view of a target structure in the form of a diaphragm, of strongly converting and weakly converting material.

In contrast to this, in the embodiment example shown in FIG. 4, the target structure is constituted flat, as a diaphragm (5). This diaphragm (5) has a diaphragm opening (22) in the center, adjoined in the radial direction by an electron-converting region (23) which consists of an electron-converting material. In the peripheral region (24), the diaphragm (5) consists of a material which does not convert electrons. Since however any material produces conversion electrons, though to a different degree, when bombarded with highly energetic electrons, only a poorer separation of the signals produced by back-scattered electrons and the signals produced by secondary electrons is possible with such a flat diaphragm.

Figure 5:
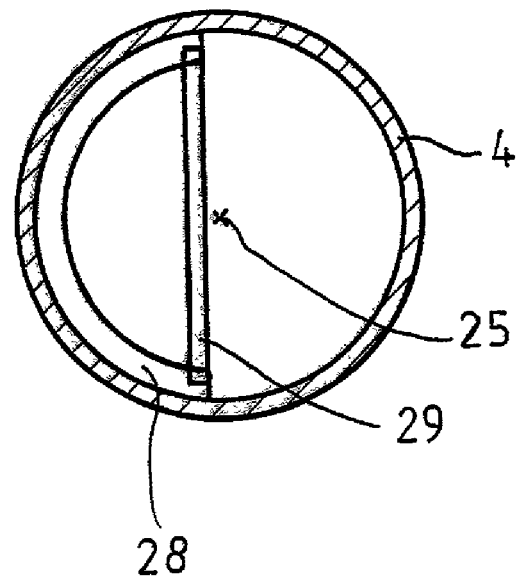
FIG. 5 shows a top view of a target structure with a web-shaped electron converting region.

The embodiment shown here in FIG. 5 for a target structure has a support constituted as a half ring (28) on which the target structure is received on the beam guiding tube (4). The two ends of the support (28) are connected together by a web (29) of material which strongly converts electrons. With this embodiment, conversion electrons are produced and detected only from the portion of the back-scattered electrons or secondary electrons which strike the web (29).

The width of the electron-converting region (6, 29) near the axis and its distance from the optical axis (25) are of course to be designed in dependence on the other construction parameters of the electron microscope and the desired energy resolution such that either only the secondary electrons, or only the back-scattered electrons, or even respectively only a selected portion of them, strike the electron-converting region (6, 29).

The detector system according to the invention can also be arranged in a region of the electron microscope in which a diaphragm, for example a pressure stage diaphragm, is in any case required. In this case, the target structure can be constituted as a flat or conical diaphragm, and can at the same time assume the function of a pressure stage diaphragm.

In the embodiment examples described with reference to FIGS. 1 and 3, a scintillation detector consisting of a photomultiplier with a scintillation layer arranged in front of it is used as the detecting system for the conversion electrons. However, it is also possible to provide a holohedral electrode instead of the photomultiplier with a scintillation layer arranged in front of it. The detection of the conversion electrons can then simply take place by means of the electrode current, if necessary with suitable amplification.

In the embodiment examples described with reference to the Figures, the electrostatic and the two magnetic dipole fields are respectively arranged mutually offset along the optical axis. However, basically a single electrostatic dipole field and a single magnetic dipole field are sufficient for the separation of the secondary electrons and the back-scattered electrons from each other and the deflection of both the secondary electrons and the back-scattered electrons from the optical axis. These two fields can also be made to overlap each other in the manner of a Wien filter. With this simplified embodiment, it is of course no longer possible to adjust the incident primary electron beam relative to the optical axis (25) defined by the objective (9).

In the embodiment example described with reference to FIGS. 1 and 3, the detection system is respectively arranged behind a hole through the beam guiding tube (4). The beam guiding tube can also alternatively be completely interrupted in this region, so that the beam guiding tube consists of two partial tubes, which are spaced apart in the direction of the optical axis (25).

We claim:

1. A detector system for a particle beam apparatus having an optical axis defining a direction and a beam guiding tube, said detector system comprising:
a target structure arranged within the beam path of said particle beam apparatus, said target structure having a near axis region adjacent to said optical axis and a region remote from said optical axis, said near axis region consisting of a material being strongly electron converting,
said region remote from said optical axis being off-set in the direction of said optical axis from said near axis region,
an electron detector system for detecting conversion electrons emitted from said near axis region, said electron detector system being arranged, measured in the direction of said optical axis, closer to said near axis region than to said region remote from said optical axis,
said electron detector system having an electrode being at a positive electrostatic potential compared to said beam guiding tube, said electrostatic potential generating a strongly localized field within said beam guiding tube so that conversion electrons emitted from said near axis region are extracted by said localized field towards said electron detector system, whereby conversion electrons emitted in other regions than said near axis region are not extracted towards said electron detector system, and
a deflecting system comprising at least an electrostatic deflection field and a magnetic deflecting field, said electrostatic and magnetic deflecting fields being aligned perpendicular to each other.

2. A particle beam apparatus having a detector system according to claim 1.

3. The particle beam apparatus according to claim 2, wherein said electrostatic deflecting field and said magnetic deflecting field are arranged offset from each other in the direction of said optical axis of the particle beam apparatus.

4. The particle beam apparatus according to claim 3, comprising two magnetic deflecting fields and an electrostatic deflecting field.

5. The particle beam apparatus according to claim 2, wherein said electrode comprises one of grid electrode or a perforated diaphragm.

6. The particle beam apparatus according to claim 2, further comprising a beam guiding tube for said particle beam apparatus wherein said detection system is arranged outside said beam guiding tube behind a hole through a wall of said beam guiding tube or in a region of an interruption of said beam guiding tube.

7. The particle beam apparatus according to claim 2, wherein said electrostatic field and said magnetic field(s) are settable independently of each other.

8. The particle beam apparatus according to claim 2, wherein said target structure is at the potential of said beam guiding tube.

9. The detection system according to claim 2, wherein said particle beam apparatus comprises a scanning microscope.

10. The particle beam apparatus according to claim 2, wherein said particle beam apparatus comprises a scanning microscope.

11. A particle beam apparatus comprising:
a particle source emitting charged particles,
a particle optical system defining a primary particle beam of charged particles emitted by said particle source to irradiate a sample with said primary particle beam,
said particle optical system defining an optical axis and having a beam guiding tube, and a detector system detecting charged particles emitted by said sample due to said irradiation of said sample with said primary particle beam, said detection system comprising:

a target structure arranged within the beam path of said particle beam apparatus, said target structure having a near axis region adjacent to said optical axis and a region remote from said optical axis, said near axis region consisting of a material being strongly electron converting and said region remote from said optical axis consisting of a weakly electron converting material, an electron detector system for detecting conversion electrons emitted from said near axis region, and a deflection system comprising at least an electrostatic deflection field and a magnetic deflecting field, said electrostatic deflection field and said magnetic deflection field being aligned perpendicular to each other, and said defection system deflecting particles emitted from said sample on varying regions of said target structure.

12. The detector system according to claim 11, wherein said region remote from said axis comprises a half ring and said region near said axis comprises a web connecting ends of said half ring remote from said axis.

13. The particle beam apparatus according to claim 11, wherein said electrostatic deflecting field and said magnetic deflecting field are arranged offset from each other in the direction of said optical axis of the particle beam apparatus.

14. The particle beam apparatus according to claim 11, comprising two magnetic deflecting fields and an electrostatic deflecting field.

15. The particle beam apparatus according to claim 11, wherein said detection system includes an electrode.

16. The particle beam apparatus according to claim 11, wherein said electrode comprises one of a grid electrode or a perforated diaphragm.

17. The particle beam apparatus according to claim 11, wherein said electrostatic field and said magnetic field are settable independently of each other.

18. The particle beam apparatus according to claim 11, wherein said target structure is at a potential of said beam guiding tube.

19. The detection system according to claim 11, wherein said particle beam apparatus comprises a scanning microscope.

20. The particle beam apparatus according to claim 11, wherein said particle beam apparatus comprises a scanning microscope.

* * * * *